United States Patent [19]
Kanai et al.

[11] 4,262,547
[45] Apr. 21, 1981

[54] PUSHBUTTON TUNER

[75] Inventors: Takao Kanai; Yasuhisa Nishikawa, both of Tokyo, Japan

[73] Assignee: Clarion Co. Ltd., Tokyo, Japan

[21] Appl. No.: 907,403

[22] Filed: May 18, 1978

[30] Foreign Application Priority Data

| May 19, 1977 | [JP] | Japan | 52-57105 |
| May 19, 1977 | [JP] | Japan | 52-63241[U] |
| May 19, 1977 | [JP] | Japan | 52-63242[U] |
| May 19, 1977 | [JP] | Japan | 52-63243[U] |

[51] Int. Cl.³ .................. F16H 35/18; H03J 1/08; H03J 1/12
[52] U.S. Cl. .................. 74/10.33; 74/10.85; 334/7; 334/74
[58] Field of Search .................. 74/10.33, 10.85; 334/7, 334/74

[56] References Cited

U.S. PATENT DOCUMENTS

| 3,279,264 | 10/1966 | Huber et al. .................. 74/10.85 X |
| 3,943,779 | 3/1976 | Ganderton .................. 74/10.33 |
| 3,946,344 | 3/1976 | Wilkinson .................. 74/10.33 X |
| 4,030,052 | 6/1977 | Pelletier .................. 74/10.33 X |
| 4,118,992 | 10/1978 | Yamagishi .................. 74/10.85 X |

FOREIGN PATENT DOCUMENTS 1295034  3/1963  Fed. Rep. of Germany .................. 334/7

*Primary Examiner*—Allan D. Herrmann

[57] ABSTRACT

A pushbutton tuner suitable for its thinner formation wherein a memory slide member is provided on a base plate of a tuner housing which is shiftable in a direction perpendicular to the sliding direction of a button slide, a gear mechanism is disposed for conjoint rotation with the associated memory slide member, said gear mechanism being connected to the base plate and a subframe attached to said base plate, and a worm wheel for transmitting the rotation to said gear mechanism through frictional members is so supported on said subframe that it may move in the direction of supporting said gear mechanism.

6 Claims, 4 Drawing Figures

PUSHBUTTON TUNER

BACKGROUND OF THE INVENTION

This invention relates to a pushbutton tuner suitable for thinner formation thereof, and more particularly to a pushbutton tuner which is capable of rendering the pushbutton tuner thinner and compact especially at its core operating mechanism portion and properly performing a clutch releasing operation without causing possible divergence or slippage in such an operation.

To make the pushbutton tuner thinner is advantageous not only for saving of the materials employed but also for use of the pushbutton tuner in combination with other mechanisms, especially for use as a car radio. Accordingly, there have been proposed various structures to reduce the thickness of the pushbutton tuner. Some of them have succeeded in rendering a pushbutton mechanism portion thinner but they still employs, for a core operating mechanism, which is also requisite for the pushbutton tuner of this type, a bulky rockable crank structure or other bulky structure associated with a crank gear which prevented obtainment of a maximum desired reduction in the thickness or size of the pushbutton tuner as a whole. The conventional pushbutton tuners have another problem. In the pushbutton tuner, the tuning operation is carried out through either a so-called one-touch tuning operation by pushbutton means or a fine tuning operation by a manual dial selector means and a clutch mechanism is provided to switch operation from one to the other of such means. The designs of the clutch operating mechanism for these conventional pushbutton tuners have been such as to frequently cause defective clutch operation after long continuous use thereof.

It is therefore an object of the present invention to provide an original and novel thinner pushbutton tuner which is free from the disadvantages of conventional pushbutton tuners as mentioned above.

SUMMARY OF THE INVENTION

In order to attain the object of the present invention as mentioned above, the pushbutton tuner of the present invention is so constructed that a gear mechanism is supported on a base plate, which mechanism is adapted to be rotated upon lateral shifting of a memory slide member. A subframe is provided on the top face of said gear mechanism, and a worm wheel for transmitting the rotation to the gear mechanism through friction members is slidably supported on the subframe so as to slide in a direction of supporting of said gear mechanism in a manner to be more specifically described.

PREFERRED EMBODIMENTS OF THE INVENTION

Figure 1:
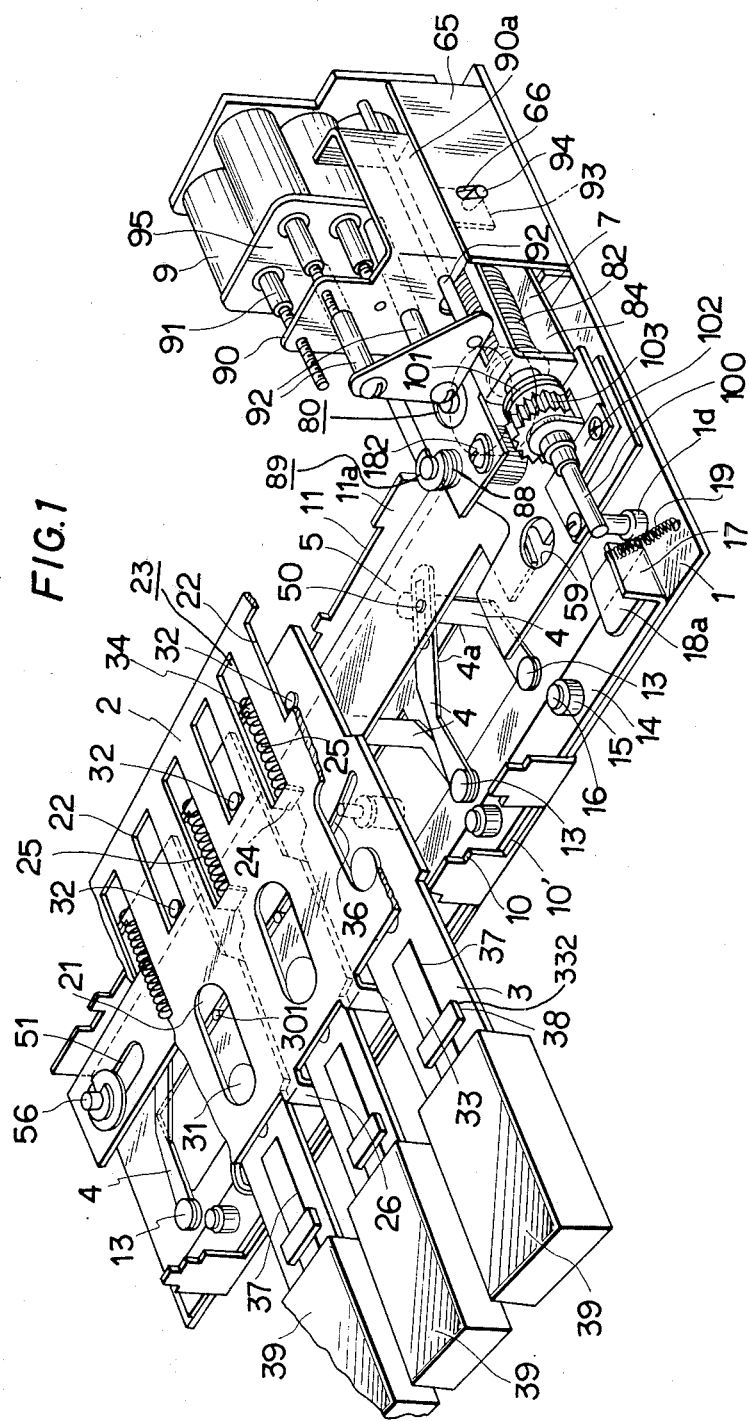
FIG. 1 is a perspective view of one form of the pushbutton tuner in accordance with the present invention, showing its assembled state.
Figure 2:
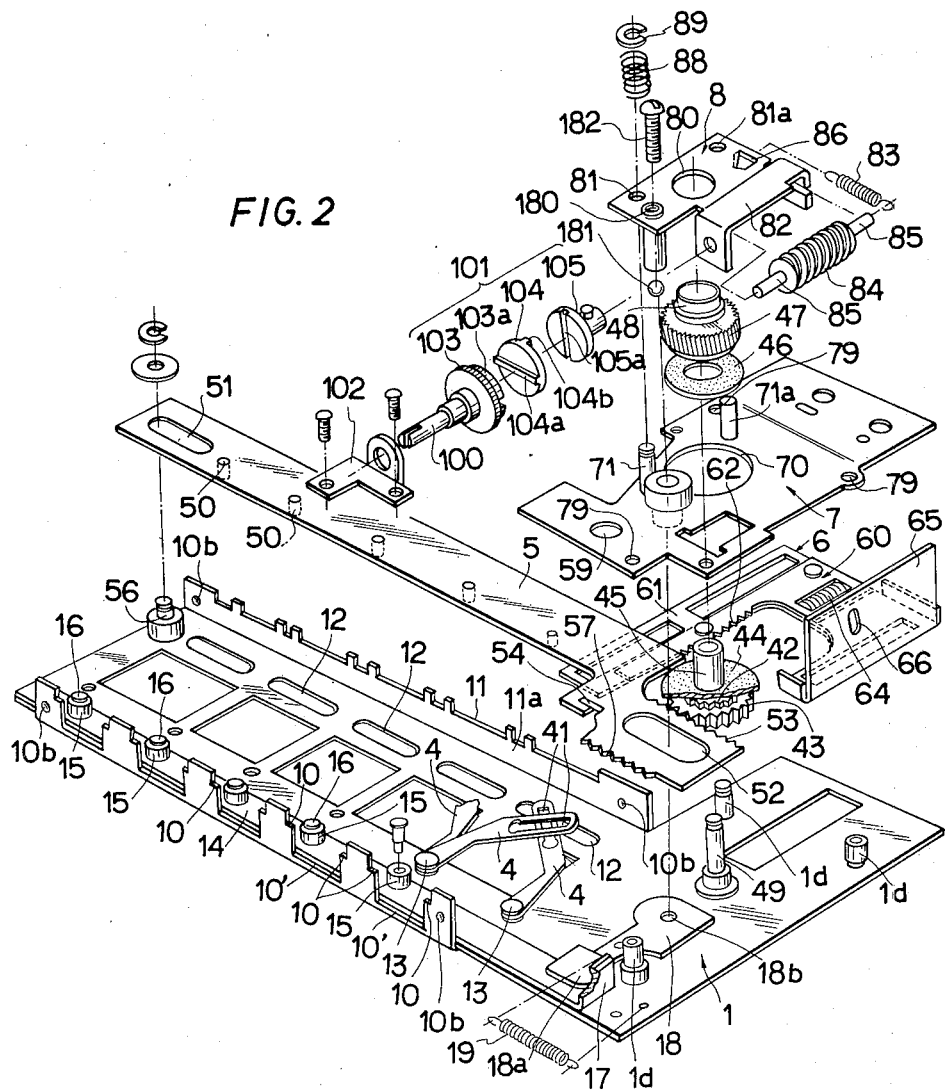
FIG. 2 is a perspective exploded view of the components mounted on the base plate.
Figure 3:
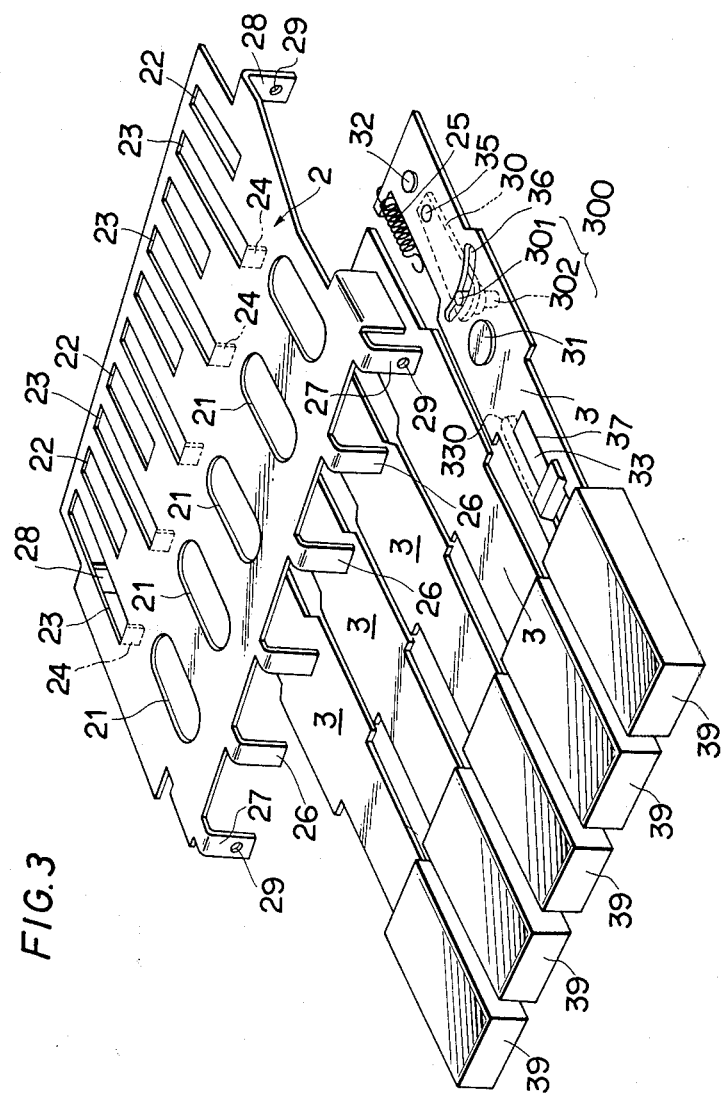
FIG. 3 is a perspective exploded view of the components mounted on the top plate.

Referring now to the drawings, especially FIGS. 1 to 3, there is illustrated one preferred embodiment of the present invention. The pushbutton tuner of this embodiment has a base plate 1 and a top plate 2. On said base plate 1 are mounted a plurality of pairs of dogleg link members 4—4 acting as actuating members for station selecting. These dogleg link members 4—4 are so disposed that each two adjacent ones are symmetrically related, with respective obtuse bends thereof facing each other as depicted in FIG. 1. Each such pair of link members 4 are pivotably connected at their base ends to the base plate 1 at their forward end portion by a common pin 13. Each link member 4 has an elongated guide slot 41 at its tip end portion. The guide slots 41 of the respective confronting pairs of link members 4—4 are cross-linked and laid on each other as best shown in FIG. 2. In each such crossing portions of these slots is inserted an engaging member 50 protruded from a bottom face of a memory slide member 5 which is disposed over the link members 4—4. Projections at the forward end of the base plate 1 are bent uprightly to form pairs of guide shoulders or seats in the upper side margins of spaced recesses 10' formed between said beat-up spaced projections. These shoulders or seats receive the edges of button slides 3. Each recess 10—10 slidably receives and slidably a diecast sliding member 33 projecting upwardly from the associated button slide 3 as shown in FIGS. 1 and 3. The rear end of the base plate 1 is also bent to form an upright guide recesses for receiving the rear ends of the button slides 3. On the other hand, the top plate 2 has a pair of guide slots 21-22, associated with each button slide 3 as shown in FIGS. 1 and 3, each of which slot extends in the longitudinal direction of the associated button slide 3. As best shown with reference to the rightmost button slide 3 of FIG. 3, guide protuberances 31 and 32 formed on each button slide 3 are registered in the associated pair of guide slots 21-22. The top plate 2 further has apertures 23 located between the respective slots 22. At the front of each aperture 23 is a depending tab 24. A spring 25 is mounted between each bent tab 24 and a hook portion 34 formed at a rear end of one side of the respective button slide 3 for restoration of the associated button slide 3 to its original position. The top plate 2 is further bent at its forward end to form guides 26 for the button slides 3 and at its four corners to form lugs 27 and 28 which are superposed onto upright portions of the base plate 1 (not shown) at its four corners and fixed thereto by suitable screws passing through openings 29 in the lugs 27 and 28 and threaded into threaded openings 10b in the base flats 1. The so disposed button slides 3, when pressed rearwardly or inwardly, will actuate the link members 4 to slidably shift the memory slide member 5 in a direction perpendicular to the pressing direction of the button slides 3. To this end, each of the button slides 3 is provided with a regulating member 30. As shown in FIG. 3, the rear end of the regulating member 30 is pivotably connected at 35 and the front end thereof has a pin 300 whose upper end 301 of reduced diameter is so disposed as to engage with an arc-like slot 36 and whose lower end 302 of larger diameter is so disposed as to engage with an inner edge 4a of an associated link member 4 assembled as mentioned above. Thus, it will be seen that when the button slide 3 is pressed inwardly keeping the regulating member 30 at a given angle preset with reference to the button slide 3, the memory slide member 5 is shifted by the link member 4.

In the thus constructed pushbutton tuner, a shaft 49 is provided at one side of the base plate 1 as shown in FIG. 2. A sleeve 45 coaxial with gears 42 and 43 and a friction plate 44 is fitted around said shaft 49. Said sleeve 45 is inserted in a worm gear member 47 through another friction plate 46. A sleeve portion 48 of said worm gear 47 is fitted in an opening 80 of a movable plate 8 and said friction plate 46 and said worm gear 47 are fitted in an opening 70 of the subframe 7 placed on the friction plate 44. Said subframe 7 has at one side end portion thereof guide pins 71 and 71a which are inserted in apertures 81 and 81a of the movable plate 8, respectively, to perform a guiding function. A spring 88 is mounted between the top end of the guide pin 71 and the top face of the movable plate 8 and a stop ring 89 is mounted on said guide pin 71 to cause the movable plate 8 to pressingly abut against the subframe 7. The movable plate 8 has one side bent downwardly to form a bearing portion 82 for a worm gear 84. A spring 83 is further provided between one shaft portion 85 of the worm gear 84 and a hook portion 86 formed on the movable plate 8 to mesh the worm gear 84 with the worm wheel 47 when said movable plate 8 is assembled as mentioned above. Another shaft portion 85 of the worm 84 is connected through a universal joint mechanism 101 to a tuning operation shaft 100 as seen from FIGS. 1 and 2. More particularly, the tuning operation shaft 100, along with a gear 103, is rotatably supported by a bearing bracket 102 provided on the subframe 7, and connected to a coupler 105 through an intermediate member 104 which has protuberances 104a and 104b extending in directions perpendicular to each other and matable with a groove 103a on the rear face of the gear 103 and a groove 105a of the coupler 105 connected to said shaft portion 85, respectively. Thus, the members 103, 104 and 105 constitute said universal joint mechanism. In this connection, it is to be noted that the subframe 7 has slots 79 at its peripheral portion which are registered with threaded members 1d of the base plate 1 by some suitable screw respectively for fixation of the subframe 7. The threaded members 1d positioned at forward portion of the base plate 1 are also used for fixing of the bracket 102.

Figure 4:
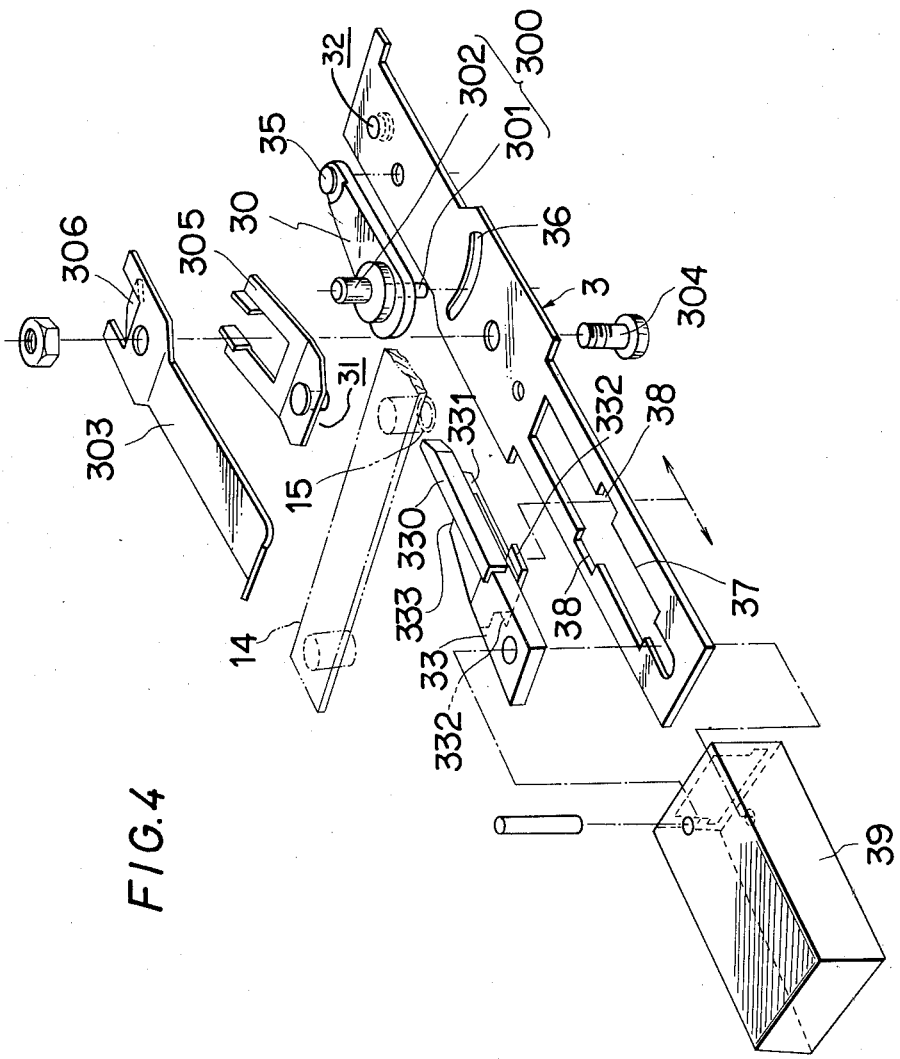
FIG. 4 is a perspective view of one form of the button slide employable in the present invention.

FIG. 4 shows one exemplary preferred form of the button slide 3 employable in the pushbutton tuner according to the present invention. In FIG. 4, a longitudinal guide slot 37 is formed in the button slide 3. The guide slot 37 has communicating recess portions 38 on the both sides of the slot 37 at its intermediate portion thereof. The sliding member 33 is attached to the so formed button slide 3. The sliding member 33 has a guide portion 331 of reduced width formed integrally therewith for registration with the slot 37. Said guide portion 331 is in turn formed by diecasting the same integrally with engaging projections 332 adapted to be inserted in said engaging recess portions 38 and adapted to be brought into contact with the top face of the button slide 3 during the sliding operation of the same and to abut against the sides of the guide slot 37. The sliding member 33 has, at its bottom side portion, an operating portion which cooperates with a roller 15 of a kick plate 14 provided at a forward end of the base plate 1, as shown in FIGS. 1 and 2, to operate a clutch mechanism. The sliding member 33 further has a cam face 333 as shown in FIG. 4 for actuation of a free end of a lever member 303 which is loosely connected at its tip end to the button slide 3 by a pin 304. The lever member 303 is connected, along with a resilient member 305 for prevention of quick actuation, to the button slide 3 by the pin 304 and is so disposed that its tip end, functioning as a suppression portion 306, may front on the forward end of the frequency regulating member 30. As mentioned above, said frequency regulating member 30 is pivotably connected at its base end to the button slide 3 by a pin 35 and has at its forward end the pin 300 whose portion 301 of reduced diameter engages with the arc-like slot 36 centered on the axis of pin 35 and whose portion 302 of increased diameter engages with the inner edge 4a of the link member 4 disposed as previously stated to actuate the memory slide member 5. In this connection, it should be noted that said suppression portion 306 acts for restriction at a position further forward than the preset position of the pin 300. This restriction action can be attained when the inclined cam face 333 of the sliding member 33 which slides according to the pressing of a pushbutton 39 and the button slide 3 pushes the base end of the lever 303 away from the face of the button slide 3 in accordance generally to the holding and restriction action of a conventional frequency regulating member in a button slide mechanism of this type.

With the so formed button slide structure according to the present invention, the guide portion of the sliding member is assembled in such a relation that it is received in the guide slot of the button slide so tht it is apparent that such a button slide structure may be formed relatively thin. Further, not only the sliding member kept in the relation as mentioned above may be slidably guided through the engagement between the guide portion and the guide slot, but also the projection provided on the guide portion is guided by the opposite face of the button slide, ensuring safe sliding of the sliding member. The projection 332, inter alia, is constantly in good engaged state since the lever 303 presses the sliding member 33 against the button slide 3 when the frequency regulating member 30 is held and restricted in a locked state and the projection 332 engages with the peripheral portion of the slot even when the regulating member 30 is out of its locking position, though said engaging projection 332 is mounted onto the button slide 3 through the recessed portion 38.

The friction plates 44 and 46 constitute a clutch mechanism. As mentioned above, the movable plate 8 which is mounted through the spring 88 on the guide pin 71 by the stop ring 89 is adapted to be lifted suitably, which will cause the release of the frictional connection between the friction plates 44 and 46. In this invention, to actuate the so constructed clutch mechanism, a cylindrical threaded member 180 is provided on a side portion of the bottom of the movable plate 80. A spherical member 181 is fitted in said threaded member 180 at its lower portion, and an adjusting screw 182 is put in said threaded member 180 so that the lower end thereof contacts said spherical member 181. Further, the kick plate 14 is provided at the forward end of the base plate 1 to be shifted by the bottom slide 3 pressed inwardly as mentioned before, in a direction perpendicular to the sliding direction of said button slide 3. The kick plate 14 has at one end an upright portion 17 which fronts on a receiving end 18a of a clutch operating member 18 disposed on the base plate 1 and pivotably connected intermediate its ends to the base plate 1. On another end of said clutch operating member 18, a circular engaging portion 18b is formed for abutment against said spherical member 181.

Thus, it will be seen that in the clutch releasing operation by the clutch operating member 18, the spherical member 181 is pushed upwardly against the action of the spring 88 to disengage said spherical member 181 from said circular engaging portion 18b. Then, the friction plate 46 is spaced from the friction plate 44 by a distance corresponding to the raised amount of the spherical member 181. As may be seen, this disengagement operation is carried out readily and easily due to the rolling action of the spherical member 181. Further, the structure for this operation may be formed compactly and suitably and installed in a limited space. Still further, the clutch operation may be suitably and readily adjusted in the assembled state by operating the adjusting screw 182, requiring no accurate adjustment at the time of assembling and allowing easy and rapid coping with possible wear or deformation in operation.

In the present invention, the core movement operating mechanism is constructed as follows. In the pushbutton tuner so constructed as mentioned above, the memory slide member 5 has elongated slots 51 and 52 at its side end positions which are adapted to be engaged with a guide pin 56 formed on the base plate 1 and the threaded member 180, respectively. The memory slide member is shifted in the lateral direction by inward movement of a button slide 3 and is guided for this movement by said guide pin 56 and said threaded member 180. The memory slide member 5 further has a rack 53 at its one end which is meshable with the gear 42 of relatively small diameter. This meshing is positively maintained by a spring (not shown) which is provided between a hook portion 54 formed on said memory slide member 5 at its portion near one end thereof and the subframe 7. The gear 43 of relatively large diameter is meshed with a rack 62 formed on an extended portion 61 of a movable plate 6 which is slidably mounted on the base plate 1. As shown in FIG. 2, an attachment member 60 is mounted on said movable plate 6, allowing some relative sliding therebetween by means of a spring 64. The rack 62 of said attachment member 60 meshes with the gear 43. The movable plate 6 has on one side an upright portion 65 which in turn has an engaging slot 66 extending vertically. With this slot 66 is engaged a pin 94 of a core mounting member 90 which supports cores 91 which are adapted to enter and leave coil assemblies 9 as shown in FIG. 1. Said coil assemblies 9 are comprised of a plurality of coils (for example six coils) integrally mounted on a holding frame 95. Said holding frame 95 has three guide rods 92 extending in parallel with one another from said frame 95. The core mounting member 90 is slidably mounted on said guide rods 92 and has at one side a bent portion 90a extending in an axial direction of the coil assemblies 9. Said bent portion 90a in turn has a hanging portion 93 with pin 94 formed thereon which engages with said slot 66 of the upright portion 65 of movable plate 6.

In the construction as mentioned hereinbefore, the gears 42 and 43 are rotated by means of the rack 53 formed on the memory slide member 5 which is shifted in a direction perpendicular to the sliding direction of the button slide 3. Due to the difference in diameter between the gears 42 and 43, the momentum of the memory slide 5 is suitably amplified to actuate the movable plate 6 in mesh with the gear 43. In this connection, it is to be noted that since the pin 94 of the core mounting member 90 mounting the cores 91 engages the slot 66 of said movable plate 6, the operation of the memory slide member 5 will cause said core mounting member 90 to be shifted, allowing the cores 91 to enter or leave the coil assemblies 9. It is further to be noted that since such a conjoint actuation as mentioned above is effected using circular gear members, the mounting directions of said core mounting member 90 and the holding frame 95 for the coil assembly 9 may be suitably selected, i.e., they may be so designed to be disposed in a direction perpendicular to the memory slide member 5 as shown in the drawings, in the direction parallel to said memory slide member 5 or at a position with some angle to said memory slide member 5. Thus, the design of the pushbutton tuner may be at discretion according to necessity, ensuring smooth and accurate core sliding operation.

According to the present invention, a worm gear mechanism is employed as a gear mechanism for conjoint movement with the memory slide which is actuated in association with the pushbutton operation. Consequently, the movement of the cores with reference to the associated coils is attained by a compact operating mechanism arrangement without using a conventional bulky rockable crank mechanism or crank gear mechanism. Thus, this invention has a remarkable advantage in that it can provide a thinner pushbutton tuner adapted for such a thinner pushbutton gear mechanism. Furthermore, said worm mechanism functions not only as a drive operation mechanism but also as a stopper mechanism for the associated members in the clutch operation, so that the worm mechanism in question can still keep its engaging relation even when the engagement of the transmission system is released upon the clutch operation. This increases the rigidity and stability of the operating mechanism and this assures a proper and accurate operative relation for continuous use.

Further according to the present invention, instead of such a configuration that all members are disposed on the base plate as in conventional pushbutton tuners, an upper plate is also used for turners of the components. More particularly, the button slide is disposed on the upper plate so as to face downwardly and the frequency regulating members are in turn disposed on said button slide so as to be operatively connected to the operating members on the base below plate. This allows separate assemblies on the base plate and the upper or top plate in the fabrication of the tuner, enabling the assembly of the pushbutton tuner to be more easily and quickly carried out. Further, this configuration allows not only the button slides but also the parts associated therewith to be arranged in a plane while disposing the button slides on the top plate and the associated parts at the lower faces of the respective button slides for operative engagement with the operating members on the bottom face, so that the resulting pushbutton tuner may be formed sufficiently thin, e.g., as thin as 10 mm or less, even if the pushbuttons are located at a height suitably spaced from the base plate for desirable pushbutton operation. Thus, the present invention can provide a thinner pushbutton tuner with the other advantages referred to. What is claimed is:

1. A pushbutton tuner which comprises: stationary support means; a plurality of button slides supported for movement in a given direction on said support means between extended and retracted positions; button slide movement responsive means supported for movement on said support means in a direction perpendicular to the direction of movement of the button slides by actuating any selected button slide; gear mechanism arranged on said support means to be rotated by said movement of said button slide movement responsive means; frequency determining means controlled by the degree of movement imparted to said gear mechanism;

manually operable means; worm wheel mechanism carried on a movable support means, said worm wheel mechanism being coupled to said manually operable means for rotation thereby; and clutch means coupled between said worm wheel mechanism and said gear mechanism, which clutch means is responsive to said bodily movement of said worm wheel and its support means by decoupling the worm wheel mechanism from said gear mechaniam.

2. A pushbutton tuner of claim 1, which further comprises:
- a movable plate engageable and conjointly movable with said gear mechanism;
- a tuning coil;
- a core adapted to be inserted into said coil;
- a core mounting member on which said core is disposed; and
- an engaging portion provided on said movable plate for engagement with said core mounting member.

3. A pushbutton tuner of claim 1, which further comprises: a clutch operating member; a circular engaging portion provided to said clutch operating member; a clutch mechanism; a movable member provided to said clutch mechanism; a spherical member engageable with said circular engaging portion to actuate said movable member and said clutch operating member conjointly; and an adjusting screw for projecting said spherical member to engage it with said circular engaging portion and adjusting the projected amount of said spherical member.

4. The pushbutton tuner of claim 1 wherein said worm wheel mechanism and support means therefor are supported for movement in a direction at right angles to the direction of movement of said button slides.

5. The pushbutton tuner of claim 1 wherein said frequency determining means includes a slidable member coupled to said rotatable gear mechanism for movement thereby in a given direction, and said worm wheel and support means therefor being bodily movable by movement by said slide member in a direction transverse to the latter direction.

6. A pushbutton tuner which comprises: stationary support means (1); a plurality of button slides (3) supported for movement in a given direction on said support means between extended and retracted positions; button slide movement responsive means (5) supported for movement on said support means in a direction perpendicular to the direction of movement of the button slide upon actuation of any selected button slide; gear mechanism (42) arranged on said support means to be rotated by said movement of said button slide movement responsive means; frequency determining means (90) controlled by the degree of movement imparted to said gear mechanism; a guide slot (37) formed in each button slide; an engaging recess (38) formed intermediate the longitudinal ends of said guide slot and communicating therewith; a sliding member (33) provided on each button slide; a guide portion (331) provided on said sliding member for engagement with said guide slot; and an engaging projection (332) formed on said guide portion and adapted to be inserted into said engaging recess for engagement with the peripheral portion of said guide slot on the lower face of said sliding member.

* * * * *